(12) United States Patent
Armbruster et al.

(10) Patent No.: US 11,921,335 B2
(45) Date of Patent: Mar. 5, 2024

(54) SYSTEM FOR DATA TRANSMISSION IN OPTICAL SYSTEMS

(71) Applicant: HIGHYAG LASERTECHNOLOGIE GMBH, Kleinmachnow (DE)

(72) Inventors: Eduard Armbruster, Berlin (DE); Frank Schulze, Berlin (DE)

(73) Assignee: II-VI DELAWARE, INC., Wilmington, DE (US)

( * ) Notice: Subject to any disclaimer, the term of this patent is extended or adjusted under 35 U.S.C. 154(b) by 0 days.

(21) Appl. No.: 17/811,800

(22) Filed: Jul. 11, 2022

(65) Prior Publication Data

US 2022/0350099 A1   Nov. 3, 2022

Related U.S. Application Data

(62) Division of application No. 16/272,179, filed on Feb. 11, 2019, now Pat. No. 11,415,765.

(30) Foreign Application Priority Data

Feb. 15, 2018 (LU) ........................................ 100706
Oct. 22, 2018 (LU) ........................................ 100973

(51) Int. Cl.
  *G02B 6/26* (2006.01)
  *G01R 31/08* (2020.01)
  (Continued)

(52) U.S. Cl.
  CPC ......... *G02B 6/4296* (2013.01); *G01R 31/083* (2013.01); *G02B 6/28* (2013.01);
  (Continued)

(58) Field of Classification Search
  CPC .... G02B 6/4296; G02B 6/28; G02B 6/29391; G02B 6/38; G02B 6/4292; G02B 6/4415;
  (Continued)

(56) References Cited

U.S. PATENT DOCUMENTS 4,134,642 A   1/1979   Kapron et al.
4,174,149 A   11/1979  Rupp
(Continued)

FOREIGN PATENT DOCUMENTS

CN   1090853 C    9/2002
CN   106330298 A  1/2017
(Continued)

OTHER PUBLICATIONS

Final Office Action in 16/272,179 dated Oct. 15, 2021, 15-pgs.
Office Action in Chinese Appl. 201910116291.3, dated Jul. 5, 2021, 7-pgs.

*Primary Examiner* — Kaveh C Kianni
*Assistant Examiner* — Hung Q Lam
(74) *Attorney, Agent, or Firm* — Blank Rome LLP

(57) ABSTRACT

The invention relates to an optical light guiding system, comprising an interface for coupling in and/or an interface for decoupling data and at least one data channel for transmitting data, and a method for transmitting data in optical systems, comprising the steps of coupling data into an interface of a beam guidance element; the transmission of the data by means of a first and/or a second data channel, which are arranged within the beam guiding element (or the casing), wherein the data channels can also be used for the fractional monitoring of the beam guiding element; and decoupling the data from an interface.

21 Claims, 4 Drawing Sheets

(51) Int. Cl.
*G02B 6/28* (2006.01)
*G02B 6/293* (2006.01)
*G02B 6/38* (2006.01)
*G02B 6/42* (2006.01)
*G02B 6/44* (2006.01)
*G08C 23/06* (2006.01)
*H04B 10/032* (2013.01)
*H04B 10/25* (2013.01)
*G02B 6/12* (2006.01)

(52) U.S. Cl.
CPC ........... *G02B 6/29391* (2013.01); *G02B 6/38* (2013.01); *G02B 6/4292* (2013.01); *G02B 6/4415* (2013.01); *G08C 23/06* (2013.01); *H04B 10/032* (2013.01); *H04B 10/25891* (2020.05); *G02B 2006/12147* (2013.01); *G02B 2006/4297* (2013.01)

(58) Field of Classification Search
CPC .. G02B 2006/12147; G02B 2006/4297; G02B 6/4469; G01R 31/083; G01R 31/54; G01R 31/58; G08C 23/06; H04B 10/032; H04B 10/25891
USPC ............................... 385/12, 24, 31, 100, 101
See application file for complete search history.

(56) References Cited

U.S. PATENT DOCUMENTS

| | | |
|---|---|---|
| 4,297,794 A | 11/1981 | Luthi |
| 4,311,142 A | 1/1982 | Machida |
| 4,595,839 A | 6/1986 | Braun et al. |
| 4,778,248 A * | 10/1988 | Arzur ................... G02B 6/4439 356/73.1 |
| 4,883,054 A | 11/1989 | Fuller et al. |
| 5,532,864 A | 7/1996 | Alexander et al. |
| 5,535,139 A | 7/1996 | Barringer et al. |
| 5,793,481 A | 8/1998 | Leali |
| 6,259,517 B1 | 7/2001 | Tedesco et al. |
| 6,559,437 B1 | 5/2003 | Pope et al. |
| 8,526,810 B2 | 9/2013 | Cole et al. |
| 9,784,642 B2 | 10/2017 | Strong et al. |
| 2007/0248358 A1 | 10/2007 | Sauer |
| 2008/0310848 A1 | 12/2008 | Yasuda et al. |
| 2011/0013905 A1 | 1/2011 | Wang et al. |
| 2012/0176243 A1 | 7/2012 | Andersen |
| 2014/0138151 A1 | 5/2014 | Islam |
| 2020/0220616 A1 | 7/2020 | Huybrechts et al. |

FOREIGN PATENT DOCUMENTS

| | | |
|---|---|---|
| DE | 19806629 A1 | 10/1998 |
| DE | 202005005869 U1 | 8/2005 |
| DE | 102004010275 B3 | 9/2005 |
| DE | 202005018553 U1 | 1/2006 |
| DE | 102008025095 A1 | 12/2009 |
| EP | 0006364 A1 | 1/1980 |
| EP | 1378778 A1 | 1/2004 |
| EP | 1662288 A1 | 5/2006 |
| EP | 2035801 A1 | 3/2009 |

* cited by examiner

SYSTEM FOR DATA TRANSMISSION IN OPTICAL SYSTEMS

CROSS REFERENCE TO RELATED APPLICATIONS

The present application is a divisional of U.S. application Ser. No. 16/272,179 filed Feb. 11, 2019, which claims priority to Luxembourg Patent Application No. LU 100973 filed on Oct. 22, 2018 and to Luxembourg Patent Application No. LU 100706 filed on Feb. 15, 2018. This application is copending with U.S. application Ser. No. 17/656,298 filed Mar. 24, 2022, which is a continuation of U.S. application Ser. No. 16/274,897 filed Feb. 13, 2019 also claiming priority to Luxembourg Patent Application No. LU 100973 filed on Oct. 22, 2018 and to Luxembourg Patent Application No. LU 100706 filed on Feb. 15, 2018. The aforementioned applications are hereby incorporated by reference in their entireties.

BACKGROUND OF THE INVENTION

Field of the Invention

The invention relates to an optical light guiding element and a system for data transmission in optical systems.

Brief Description of the Related Art

For high-performance fiber optic cables, a protection against uncontrolled leaking laser radiation is prescribed for reasons of safety at work. Therefore, it is recommended to use a safety system to monitor the breakage of fiber optic cables, as damage (such as fiber breakage) releases dangerous amounts of laser light that can cause irreversible damage to the human body. Therefore, even in the event of damage to fiber optic cables, a security system should be triggered and shut down the laser.

Solutions for fiber optic cables breakage monitoring are known from the prior art. For example, published German patent application DE 19806629 A1 discloses a method for monitoring the bending radius and for breakage monitoring of optical cables and further a light guide cable for application of said method. The monitoring is performed by introducing at least one additional optical fiber to the main optical fiber into the optical cable, which is equipped with a receiving system. The variation of radiation transmitted through the monitoring fiber is used to detect excessive bending or breakage. When a dangerous condition is detected, a warning signal is generated, or the power transmission is switched off.

Published German utility model DE 20 2005 005 869 U1 discloses a supply line, in particular a tube package for an industrial robot, with a number of cables and/or lines as well as with an integrated monitoring sensor for monitoring the deformation of the supply line, which comprises a cladding-free optical fiber, which is surrounded by a sheath so that it is pressed by force against the optical fiber, wherein the optical fiber is connected to a feed point for coupling-in light and with an evaluation device.

Published European patent application EP 1 662 288 A1 (corresponding to published German utility model DE 20 2005 018 553 U1) discloses a protective device for an optical fiber, comprising a protective tube, at least one electrical conductor loop guided through the protective tube with a defined electrical impedance and a special electrical impedance insulation of the conductor loop, wherein the protective tube has a two- or multi-layered construction, consisting of an inner layer of an optically transparent, electrically insulating material and at least one overlying layer of a non-transparent material, and further a conductor loop is routed through the tube in addition to the optical fiber, consisting of two mutually insulated electrical conductors which are connected at one end of the tube via a defined electrical impedance and at the other end to an impedance-controlling measuring unit, and wherein the insulation of the two electrical conductors is chosen such that it results from the thermal effect of leaking light in the event of breakage of the optical fiber or by the radiation, either to influence the electrical conductors or to direct contact of the electrical conductors or at least one of the electrical conductors is severed, and finally a change of the resistance is detectable by the measuring unit.

Thus, the breakage in fiber optic cables is currently monitored based on the detection of electrical parameters by monitoring elements integrated into the light guiding cable, such as two or three electrical conductors, which are separated from each other by an insulation which changes their property upon irradiation with laser light.

In addition to the monitoring function, data transmission along the light guiding system is desired. These data include control signals for coupled or connected systems, as well as data transmitted by sensors or data containing characteristics of connected systems. For the purposes of the present invention, these data are also referred to as user data.

For the transmission of such data additional, separately running data lines can be used. A disadvantage of such a solution is the cumbersome handling for the user.

SUMMARY OF THE INVENTION

An object of the present invention is therefore to provide an optical system in which user data can be transmitted without additional design effort for the user.

The present invention provides an optical light guiding element, comprising an interface for coupling in and/or an interface for decoupling data and at least a first data channel for transmitting data.

In a further embodiment, the light guiding element comprises at least a first electrical channel and a second electrical or optical channel.

Furthermore, the light guiding element can also comprise an optical channel as the second data channel.

It is also provided according to the invention that the light guiding element comprises as the first data channel, an electrical line for driving a source of the second data channel and as the second channel, an electrical line or the optical control fiber that is arranged in the light guiding element.

In a further embodiment of the invention the light guiding element it is provided that the second data channel can connect the at one end of the light guiding element arranged source for generating an electrical signal, an electromagnetic wave or an optical signal with a detector arranged at the other end of the light guiding element.

Furthermore, the light guiding element can comprise at least one plug-in connection for transmitting user data, communication with sensors and/or actuators, the electrical control of the source at one end of the light guiding element and/or the signal from the source to the detector and/or the signal of the detector.

According to the invention, it is provided in a further aspect that the source is arranged in a plug connection connected to the light guiding element or in the light guiding element itself.

The invention also includes an embodiment in which a plug connection connected to the light guiding element interrupts electrical and/or optical channels.

The light guiding element may further comprise plug-in connections at both ends for both channels for connection to further light guiding elements.

In a further embodiment, the light guiding element may comprise at least one monitoring channel as a data line or separate data lines along the system.

Another object of the present invention is a light guiding system, which consists of at least two interconnected light guiding elements, as described above, or interconnected light guiding components, comprising light guiding elements, as described above.

Furthermore, the present invention comprises a method for transmitting data in optical systems comprising the steps:
a. Coupling data into an interface of a light guiding element;
b. Transmission of the data by means of a first and/or a second data channel which are arranged within the light-guiding element
c. Decoupling the data from an interface of a light guiding element.

The invented method also includes the use of electrical conductors as the first data channel.

Furthermore, in the method, the second data channel may be a control fiber or an electrical line.

The inventive method further provides that data is transmitted electrically via the first data channel and data is transmitted via the second data channel electrically, optically or electromagnetically.

Furthermore, in the method according to the invention, the data to be transmitted can be generated within and/or outside the light guiding element.

The method further provides that the data to be transmitted are generated in a connector coupled to the light guide.

Another object of the invention relates to the use of the previously described method in a light guidance system comprising at least two interconnected light guiding elements as described above.

Furthermore, the invention relates to the use of a light guiding element as described above or a light guiding element according to the above embodiments for transmitting data in an optical system.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in part in the description which follows and in part will be obvious from the description or may be learned by practice of the invention.

BRIEF DESCRIPTION OF THE FIGURES

The invention will be described based on figures. It will be understood that the embodiments and aspects of the invention described in the figures are only examples and do not limit the protective scope of the claims in any way. The invention is defined by the claims and their equivalents. It will be understood that features of one aspect or embodiment of the invention can be combined with a feature of a different aspect or aspects of other embodiments of the invention, in which:

DETAILED DESCRIPTION OF THE INVENTION

Figure 1:
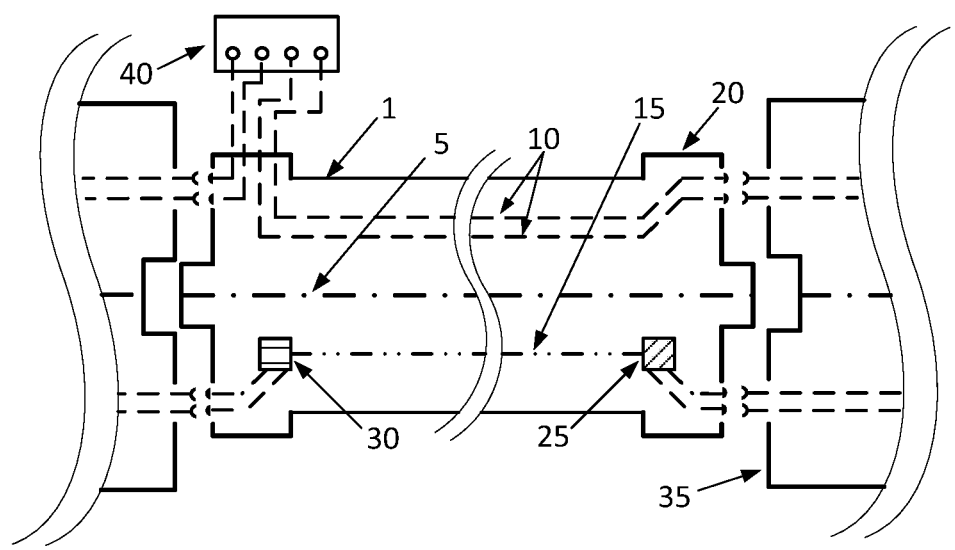
FIG. 1 shows a fiber optic cable with power fiber, as well as electrical channel and control fiber

The above-stated object of the invention is solved by the features of the non-dependent claims. The dependent claims cover further specific embodiments of the invention.

The invention relates to an optical light guiding system, comprising an interface for coupling in and/or an interface for decoupling data and at least one data channel for transmitting data, and a method for transmitting data in optical systems, comprising the steps of coupling data into an interface of a beam guidance element; the transmission of the data by means of a first and/or a second data channel, which are arranged within the beam guiding element (or the casing), wherein the data channels can also be used for the fractional monitoring of the beam guiding element; and decoupling the data from an interface.

The terms light guiding elements and optical elements will be used synonymously in connection with the description of the present invention. Both can designate a fiber optic cable or a connector for fiber optic cable. Plug or connections for coupling-in and decoupling of laser radiation are also encompassed by these terms. An optical system is formed of light guiding elements or optical elements.

The object of the invention is achieved in that the elements which are used for monitoring a break of a fiber optic cable or a light guiding system, are also used for the transmission of user data or provided within a light guiding system separate elements for data transport.

A channel within the meaning of the present invention designates a part of the entire security channel of the invention, which thus always consists of at least two channels and is used for the transmission of user data—that is, data independent from the monitoring function. The entire safety channel is integrated into the parts of the beam guiding system, e.g. fiber optic cable, optical connector, etc.). The present invention thus provides a safety channel which, even if one channel fails, ensures the safety of a system in operation. The two-channel safety channel thus increases the reliability in the detection in the sense that in fact is only switched off when there is damage and not even when there is a malfunction of a single monitoring channel. The at least two channels as part of a safety channel according to the invention can be different or the same in terms of their function and mode of operation. Each channel is inside the protective tube, i.e. in the immediate vicinity of the power fiber. However, they are separate parts, i.e. no components of the power fiber.

A channel as part of the security channel, which can be used for the transmission of user data, is, for example, an electrical channel which runs along the beam guiding system and is capable of transmitting data on its own.

The geometry of the electrical conductors is not limited, so possible designs are several separate conductors, a least two-core cable or the lines may be coaxial with each other.

An optical channel as part of a security channel according to the invention is a combination of at least one separate, so-called monitoring or control fiber that is fed in addition to the power fiber into the protective tube and the necessary coupling elements and required for the electrical transmission and processing converter. At least one material of the monitoring or control fiber is configured in a manner that it absorbs the wavelength of the high-power laser radiation, i.e. at least one of core, cladding, protective coating or outer shell. The monitoring or control fiber carries light for monitoring or transmitting user data. The optical channel runs along the beam guiding system and is independently able to transmit user data in addition to the security function.

The forwarding within the beam guiding system as well as the evaluation unit may include a conversion of the optical signals into electrical signals (and vice versa).

These elements are, for example, monitoring elements which can be multi-channeled. The term "multi-channel" in the sense of the present invention means that the elements use at least two channels, as for example takes place with one electrical and one optical channel or two electrical channels.

When using elements that are used for security monitoring of the optical system, care must be taken that this security function is not affected by the transmission of the user data.

For a better understanding of the invention, the safety components are shown and described below with reference to the figures, so that their use for data transmission is easier to understand. The words channel and data channel are used synonymously.

FIG. 1 shows an embodiment in which the optical fiber cable is sheathed with a protective tube 1 and, in addition to the power fiber 5, a further so-called control fiber 15 is laid within the same protective sheath and a source 25 and a detector 30 are inserted into the fiber optic cable connector 20 or fiber optic cable connector., respectively fiber optic cable socket 35 are added. The control fiber should be arranged in a manner that it will also be damaged if the power fiber is damaged to ensure reliable detection. The control fiber guides an electromagnetic wave, which is generated by a source/(a) transmitter, from one end of the optical fiber cable to the other. The other end of the control fiber is terminated with a detector/receiver, which detects whether the control fiber is intact when the wave emitted by the source is received correctly at the detector.

The coaxial cable 1 forms the first monitoring channel 10 and the control fiber 15 a second monitoring channel along power fiber 5. Both channels use different media (electrical and optical) for the signal line of the monitoring signals and thus create a true diversity and redundancy.

It must be ensured when implementing this concept, that a suitable control fiber 15 is used. In particular, the absorption of the control fiber 15 in the wavelength range of the power carried in the power fiber 5 and the crosstalk (optical coupling) of power fiber into the control fiber are to be considered.

Crosstalk from the power fiber 5 into the control fiber 15 may be separated from the signal of the power fiber 5 by a suitable signal patterns generated by source 25. A suitable signal pattern is any property of the light generated by source 25, which differs from characteristics of the light carried in the power fiber 5. This may be, for example, a particular wavelength, a combination of different wavelengths or the modulation of the signal generated by the source.

By appropriate spectral choice of the source and the detector as well as by sheathing the control fiber crosstalk can be minimized.

The access to the signals or user data can be realized both by separately led out of the fiber optic cable connector 20 connection cable (plug 40 in FIG. 1) and directly by contacting the plug monitoring in the fiber optic cable socket 35.

The plug-in monitoring is a device that monitors whether the end of the optical cable or light guiding system is properly inserted into the appropriate recording.

Figure 2:
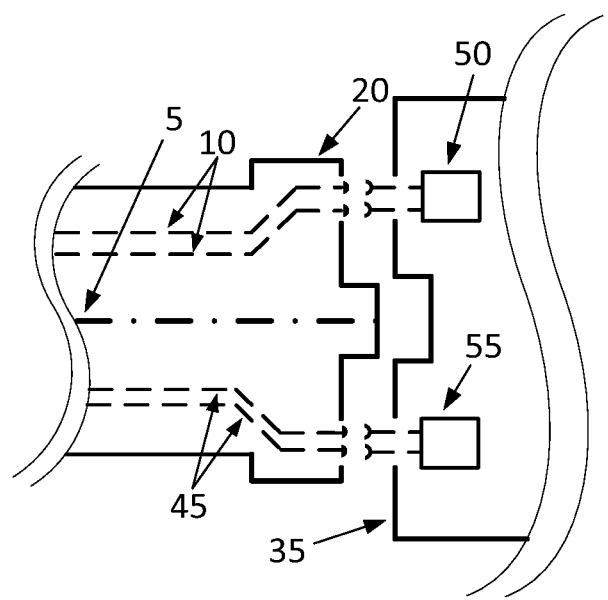
FIG. 2 shows an optical fiber cable with second coaxial cable as the second electrical channel

FIG. FIG. 2 shows another embodiment in which a further (coaxial) cable 45 is inserted in the optical fiber cable in addition to the power fiber 5 and the already existing (coaxial) cable 10 for breakage monitoring instead of the control fiber 15 for breakage monitoring and thus forms the second channel of the monitoring system. The evaluation of both channels can be designed in different ways. One possibility is the parallel evaluation of both channels. For this purpose, proven evaluation principles can be used. The optical fiber cable plug 20 is connected to the optical fiber cable socket 35, in which impedance 1 50 is connected to the coaxial cable 1 10 and impedance 55 to the coaxial cable 2 45.

Figure 3:
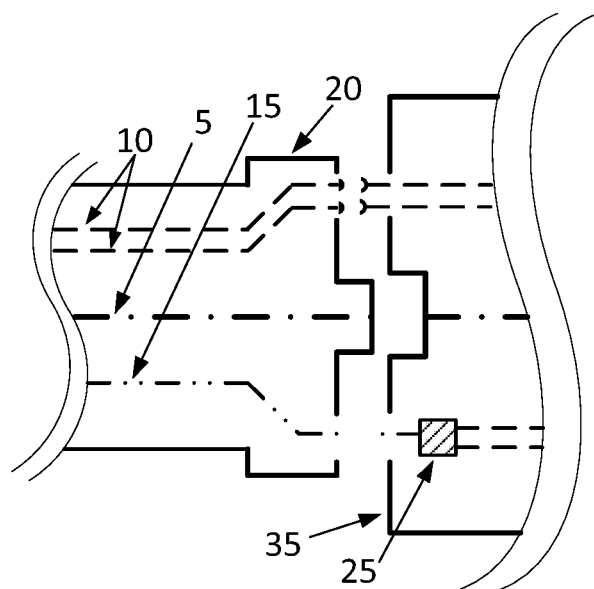
FIG. 3 shows a schematic representation of a redundant and diverse transfer point

FIG. 3 shows the basic structure of a redundant and diversified transfer point between e.g. optical fiber cable plug 20 and optical fiber cable socket 35. Both monitoring channels go over at the transfer point to the next component of the light delivery system. The source/transmitter 25 was moved from the optical fiber cable plug 20 into the optical fiber cable socket 35. By transfer of the electrical channel, designed as a coaxial cable 1 10 and the optical channel (control fiber 15) offers the plug monitoring now the advantage of dual-channel and diversity. Possible disorders, such as shorting the electrical contact of the fiber connector (or inadvertently terminating with the terminating impedance) will not cause the safety function to fail.

In addition to the electrical connection, a defined optical coupling between the source/transmitter and the monitoring element in the optical fiber cable must be ensured.

Figure 4:
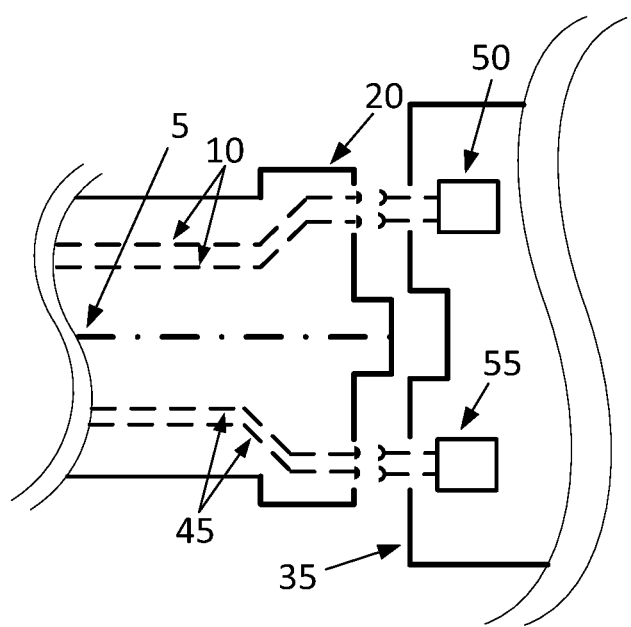
FIG. 4 shows a schematic representation of redundant plug-in monitoring at the transfer point

FIG. 4 shows a redundant plug-in monitoring. The structure corresponds to the description in FIG. 2. Here, both channels are electrically designed. The interconnection of the plug-in monitoring shown in FIG. 4 represents a possible variant. The plug-in monitoring interrupts both channels of the fraction monitoring integrated in the optical fiber cable. This interruption can be detected by a suitable evaluation.

Figure 5:
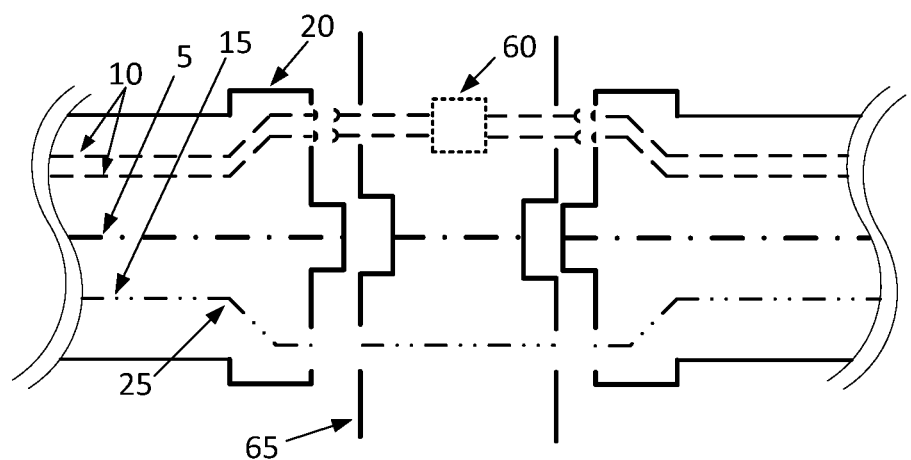
FIG. 5 shows a serial connection of light guiding components

In FIG. 5, an optical fiber cable is shown with plug 20 having two monitoring circuits as described above. Both are transferred at the optical fiber cable socket to the next component 65 of the light guidance system (also subsystem). It is a coaxial cable 1 10 as a first channel and a control fiber 15 shown as a second channel. The embodiment shown in FIG. 5 relates to the connection of further sub-systems to the embodiments described above and thus the realization of duplexing of sub-system without weakening of the security requirements. As a result, the continuous, redundant monitoring runs across the connection of two subsystems.

The source of the subsystems forms the light guidance system, which is also called a system. A source 25 generates suitable electrical signals which are fed into a monitoring channel. The second monitoring element forms the second channel (or return channel). This can be designed both optically (see above) and electrically (see above). By returning the signal via the monitoring channel 2, it is possible to arrange the feed and the evaluation of the monitoring signals at the same end of the light guidance system.

The light guidance system must be designed in a manner that there is either only a coupling between the two monitoring channels at the end of the monitoring chain, or both monitoring channels are evaluated separately.

In the case of several interconnected subsystems, it is advantageous to implement a control and condition monitoring of the components involved. This requires data transmission along the light guidance system. In the simplest case, this could be realized by a separate running wiring (prior art), which, however, is cumbersome to handle for the user.

The invention integrates a data transmission path into the light guidance components involved. This integration also allows the development of more feature-rich components. Thus, for example, the integration of additional sensors, data storage, actuators, etc. can be realized in the components of the light delivery system which can be controlled without additional effort of the user or can be read.

By using internally routed data transfer channels, inter-modular communication along the light delivery system can be realized. This allows the transport and exchange of user data.

In a further embodiment of the invention, user data are distributed along the light guiding system (optical fiber cable, optical fiber cable coupler, etc.). The distribution of the data includes not only a purely passive data transport (which is additionally possible), but also a direct integration of the participating subsystems as active components (referred to as optional communication member 60 in FIG. 5) in the resulting network.

The sub-systems which now form the network, can both be executed passively (pure data transport, no manipulation of the data stream) and actively (participation in the data exchange). For example, if the fiber optic cable or other component of the light guidance system is an active participant in the data transfer, it may receive, process, and/or feed user data (e.g., serial number, type, sensor data, etc.) from the data stream. The same applies to all other connected subsystems.

User (or payload) data refers to all types of data that have nothing to do with the maintenance of the safety function. This can be any data of all connected subsystems and their peripherals. This includes control signals for the operation of the sub-systems as well as sensor data.

One way of participating in the data stream would be, for example, the integration of additional data lines into the optical fiber cable as well as the lead-out via additional connections on the optical fiber cable connector. However, this involves the disadvantage of additional elements in the light guide cable and in the plug. The advantage of this option is the independence of the data transport from the security monitoring.

Another possibility is to use the connections and connections for the data transmission, which are integrated anyway for the optical fiber cable safety circuit. The additionally required elements for coupling and decoupling the data must not impair the safety function.

The transmission of user data can take over parts of the safety function or even the safety function completely. This can be done for example by a combined data stream of security and user data.

If passive components (for example traffic light cables) are to become active components so far, a power supply for the active parts has to be guaranteed. This can be done via separate connections or be implemented to a limited extent via the data lines themselves.

Figure 6:
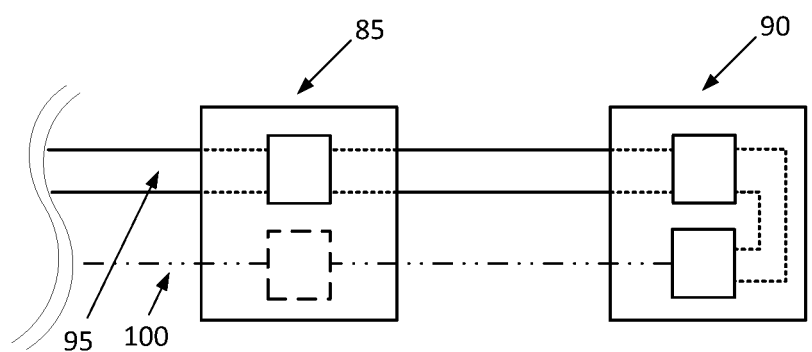
FIG. 6 shows a structure of a data transmission path in subsystems

FIG. 6 shows a possible basic structure of the data transmission path on the basis of the sub systems 4, 85 and sub system 5, 90. In this case, a redundantly diverse security system comprising monitoring channel 1, 95 and monitoring channel 2, 100 is represented by way of example as data transmission paths. However, the operation is applicable regardless of the transmission Medium.

In this case, each active subsystem includes a communication member 60 which receives the incoming data stream, modifies it depending on the task of the subsystem and sends it on to the next subsystem. The final sub system in the chain closes the connection between the two transmission channels and thus represents the end of the chain.

To separate the security function and the user data as well as the integration of the network consisting of subsystems into a higher-level system, an evaluation unit 105 may be necessary.

Figure 7:
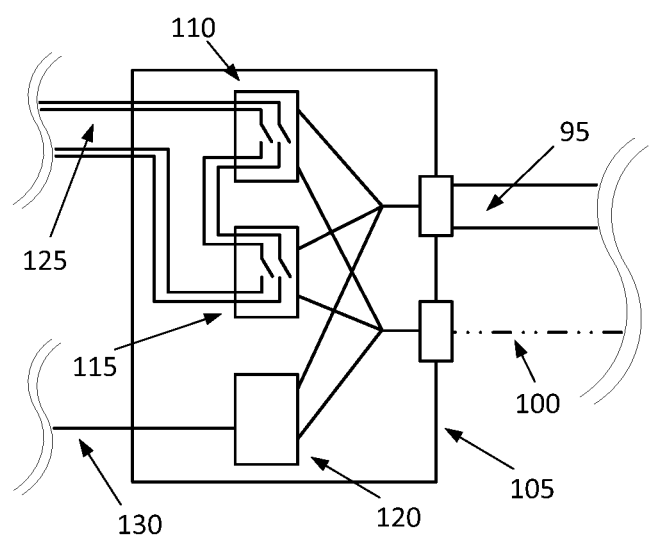
FIG. 7 shows as schematic structure of evaluation unit

FIG. 7 shows the schematic structure of an evaluation unit 105. This serves two main purposes:
  a. Monitor the parameters relevant to the safety function (e.g. safety ID A (SIDA), safety ID B (SIDB), cycle time, short circuit in the transmission channel, interruption in the transmission channel, etc.) of the transmission path and output their status (output safety circuit).
  b. To provide an interface for coupling and decoupling the user data IDN (user data/communication).

If the two channels are interconnected completely independently of each other with the evaluation unit (or the evaluation units), it is of course also possible to send only the security IDs on the respective channel, i.e. SIDA on the one channel and SIDB on the other.

The evaluation unit 105 forms the coupling element between the transmission channels 1, 95 and 2, 100 to the higher-level system. Evaluation SIDA 110, SIDB 115 and IDN 120 are carried out in evaluation unit 105. Evaluation unit 105 also has the output of safety circuit 125 and an output of the user data or data for communication 130.

Figure 8:
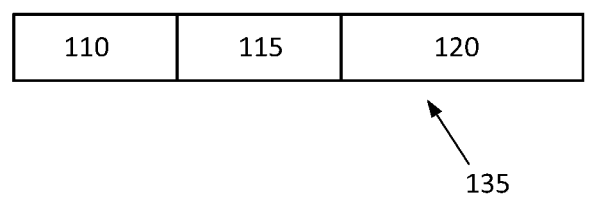
FIG. 8 shows the structure of a data package

FIG. 8 shows a possible structure of the data packet 135 which is sent by the evaluation unit 105 (not shown), modified by the communication modules (not shown) of the subsystems and received again by the evaluation unit and evaluated. The data packet 135 comprises the data of the evaluation SIDA 110, SIDB 115 and IDN 120.

SIDA and SIDB represent individually unique (per overall system) identification characteristics of the redundantly constructed safety evaluations. Each safety evaluation sends and evaluates only the identification feature determined by it and for it.

If SIDA and SIDB are transmitted cyclically, the time for such a cycle depends on the required reaction time of the safety function and is also monitored by the components of the evaluation unit responsible for the safety.

The rest of the time of one cycle, which is not needed for the transfer of the SIDA and SIDB, is used for the transmission of user data IDN.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention.

The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

REFERENCE NUMERALS 1 protective tube
5 power fiber
10 coaxial cable 1
15 control fiber
20 optical fiber plug
25 source/transmitter
30 detector/receiver
35 optical fiber cable socket
40 plug
45 coaxial cable 2
50 impedance 1
55 impedance 2
60 communication member
65 component of light guiding system
70 sub-system 1
75 sub-system 2
80 sub-system 3
85 sub-system 4
90 sub-system 5
95 monitoring channel 1
100 monitoring channel 2
105 evaluation unit
110 evaluation SIDA
115 evaluation SIDB
120 evaluation IDN
125 output safety circuit
130 user data/communication
135 data packet

What is claimed is:

1. An apparatus to communicate high-power laser light for a laser processing operation in a high-power laser system, the apparatus comprising:
a cable having first and second ends;
a power fiber disposed inside the cable and configured to transport the high-power laser light between the first and second ends of the cable;
a first monitoring channel disposed inside the cable and being configured to conduct a first monitoring signal between the first and second ends of the cable;
a second monitoring channel disposed inside the cable and being configured to conduct a second monitoring signal simultaneously with the first monitoring signal between the first and second ends of the cable; and
an evaluation unit disposed in communication with the first and second monitoring channels, the evaluation unit being configured to redundantly monitor for interruption in the transport of the high-power laser light for the power fiber based on monitoring, redundantly, the first and second monitoring signals, the evaluation unit interfacing with user data associated with the high-power laser system, the evaluation unit being configured to transmit a user data signal having the user data as the at least one of the first and second monitoring signal in at least one of the respective first and the second monitoring channels, wherein the user data signal transmitted as the monitoring signal in the at least one first and second monitoring channels is used both to monitor for the interruption in the transport of the high-power laser light and to transmit the user data.

2. The apparatus of claim 1, wherein the user data transmitted in the user data signal is selected from the group consisting of a control signal, sensor data, a data transmission, a data stream, an intermodular communication, a serial number, and a type.

3. The apparatus of claim 1, wherein the user data signal is transmitted electrically via the first monitoring channel; and wherein the user data signal is transmitted electrically, optically, or electromagnetically via the second monitoring channel.

4. The apparatus of claim 1, wherein the user data signal is generated within the cable, outside the cable, and/or in a connector coupled to the cable.

5. The apparatus of claim 1, further comprising at least two subsystems of the high-power laser system, each having a connection configured to couple to one of the first and second ends of the cable, each connection being configured to connect in communication with the power fiber, the first monitoring channel, and the second monitoring channel.

6. The apparatus of claim 5, wherein to transmit the user data signal between the at least two subsystems, the evaluation unit is configured to transport the user data in a data stream from a first of the at least two subsystems to a second of the at least two subsystems, the first subsystem being configured to passively execute the transport without manipulation of the data stream.

7. The apparatus of claim 5, wherein to transmit the user data signal between the at least two subsystems, the evaluation unit is configured to exchange the user data in a data stream from a first of the at least two subsystems to a second of the at least two subsystems, the first subsystem being configured to actively execute the exchange.

8. The apparatus of claim 5, wherein to transmit the user data signal between the at least two subsystems, the evaluation unit is configured to at least one of: transmit control data in the user data signal configured to operate one of the at least two subsystems; and transmit sensor data in the user data signal between the at least two subsystems.

9. The apparatus of claim 5, wherein at least one of the at least two subsystems comprises an active part used in the transfer of the user data signal, wherein at least one of the first and second monitoring channels is configured to supply power to the active part.

10. The apparatus of claim 5, wherein at least one of the at least two subsystems comprise an active participant being configured to transmit the user data signal in at least one of the first and second monitoring channels, the user data signal having payload data usable by at least one of the at least two subsystems, the payload data being used as at least one of the first and second monitoring signals for the redundant monitoring of the interruption.

11. The apparatus of claim 10, wherein the payload data comprises one or more of: user data, a serial number, a type, sensor data, a control signal, non-safety function data, data associated with at least one of the at least two subsystems, and data associated with a peripheral of the at least two subsystems.

12. The apparatus of claim 5, wherein each of the first and second ends of the cable comprises a cable plug disposed on the respective end of the cable and being configured to connect to a socket of one of the at least two subsystems, the cable plug having transfer points for the power fiber, the first monitoring channel, and the second monitoring channel configured to connect to the socket.

13. The apparatus of claim 1, wherein the evaluation unit is configured to monitor the first and second monitoring signals for at least one of: a safety function, a cycle time, a short in transmission, and an interruption in transmission.

14. The apparatus of claim 1, wherein to redundantly monitor for the interruption in the transport of the high-power laser light for the power fiber based on the first and second monitoring signals, the evaluation is configured to detect the interruption as a plug-in interrupt of the power fiber, breakage damage of the power fiber, or a misconnection of either of the first and second monitoring channels, wherein the evaluation unit is configured to shut down the high-power laser system in response to the detected interruption.

15. The apparatus of claim 14, wherein at least one of the first and second monitoring channels comprises an optical fiber, and wherein an absorption of a material of the optical fiber is within a wavelength range of the laser power transported in the power fiber.

16. The apparatus of claim 1, wherein the first monitoring channel is an electrical line configured to conduct an electrical monitoring signal for the first monitoring signal; and wherein the second monitoring channel is an optical fiber configured to conduct an optical monitoring signal for the second monitoring signal.

17. The apparatus of claim 16, wherein the evaluation unit comprises a source disposed in communication with the optical fiber and the electrical line, the source being powered at least in part by the electrical monitoring signal of the electrical line and being configured to generate the optical monitoring signal for the optical fiber.

18. The apparatus of claim 17, wherein the source is arranged in a socket to which at least one of the first and second ends of the cable connects, in a cable plug disposed on at least one of the first and second ends of the cable, in the cable itself, or in a device connected to the cable.

19. The apparatus of claim 16, wherein the evaluation unit comprises a detector disposed in communication with the optical fiber and being configured to detect the optical monitoring signal.

20. The apparatus of claim 19, wherein the detector is arranged in a socket to which at least one of the first and second ends of the cable connects, in a cable plug disposed on at least one of the first and second ends of the cable, in the cable itself, or in a device connected to the cable.

21. The apparatus of claim 1, further comprising a security channel being configured for transmission of the user data, wherein the security channel is an electrical channel.

* * * * *